(12) United States Patent
Tai

(10) Patent No.: US 7,105,458 B1
(45) Date of Patent: Sep. 12, 2006

(54) METHOD OF ETCHING SEMICONDUCTOR DEVICES USING A HYDROGEN PEROXIDE-WATER MIXTURE

(75) Inventor: Kaori Tai, Tokyo (JP)

(73) Assignee: Oki Electric Industry Co., Ltd. (JP)

( * ) Notice: Subject to any disclaimer, the term of this patent is extended or adjusted under 35 U.S.C. 154(b) by 837 days.

(21) Appl. No.: 09/639,163

(22) Filed: Aug. 16, 2000

(30) Foreign Application Priority Data

Mar. 13, 2000 (JP) .................................. 2000-068010

(51) Int. Cl.
*H01L 21/302* (2006.01)
*H01L 21/462* (2006.01)

(52) U.S. Cl. .................. 438/742; 438/755; 257/E21.309

(58) Field of Classification Search ............ 438/682, 438/656, 649, 749, 721, 742, 755; 257/E21.017, 257/E21.02, E21.309
See application file for complete search history.

(56) References Cited

U.S. PATENT DOCUMENTS

| | | | | |
|---|---|---|---|---|
| 5,776,822 A | * | 7/1998 | Fujii et al. ................ | 438/586 |
| 5,834,368 A | * | 11/1998 | Kawaguchi et al. ........ | 438/621 |
| 5,877,085 A | * | 3/1999 | Matsubara .................. | 438/649 |
| 5,933,757 A | * | 8/1999 | Yoshikawa et al. ......... | 438/682 |
| 5,981,380 A | * | 11/1999 | Trivedi et al. .............. | 438/639 |
| 6,008,141 A | * | 12/1999 | Ibara et al. ................. | 438/754 |
| 6,051,496 A | * | 4/2000 | Jang .......................... | 438/687 |
| 6,074,960 A | * | 6/2000 | Lee et al. ................... | 438/739 |
| 6,136,699 A | * | 10/2000 | Inoue ......................... | 438/656 |
| 6,221,764 B1 | * | 4/2001 | Inoue ......................... | 438/649 |
| 6,245,191 B1 | * | 6/2001 | Derderian et al. ........... | 156/345 |
| 6,277,674 B1 | * | 8/2001 | Wang et al. ................. | 438/132 |
| 6,319,801 B1 | * | 11/2001 | Wake et al. ................. | 438/585 |
| 6,335,294 B1 | * | 1/2002 | Agnello et al. ............. | 438/755 |

OTHER PUBLICATIONS

Goto et al., "Leakage Mechanism and Optimized Conditions of Co Salicide Process for Deep–Submicron CMOS Devices" IEDM Tech., Dig. 1995 IEEE, pp. 449.

* cited by examiner

*Primary Examiner*—William David Coleman
(74) *Attorney, Agent, or Firm*—Venable; James R. Burdett

(57) ABSTRACT

The present invention is a method of producing semiconductor devices and an etching liquid with which the titanium nitride film can be removed without thinning of the CoSi layer. A hydrogen peroxide-water mixture is used for removal of the titanium nitride film in the method of producing semiconductor devices by cobalt salicide technology with titanium nitride as the cap film.

8 Claims, 4 Drawing Sheets

PRIOR ART

METHOD OF ETCHING SEMICONDUCTOR DEVICES USING A HYDROGEN PEROXIDE-WATER MIXTURE

BACKGROUND OF THE INVENTION

1. Field of the Invention

The present invention relates to a method of producing semiconductor devices and an etching liquid used in this production.

2. Description of Related Art

In recent years progress has been made in device refinement, and gate wiring resistance, parasitic resistance of the source drain part of transistors, and contact resistance have risen accordingly. Therefore, there is a problem with conventional devices in that the high-speed operation that is anticipated based on a scaled model cannot actually be realized.

As a result, silicide (self-alignment silicide) technology is used with which silicide film of a metal with a high melting point is formed in self-aligning manner on the gate and diffusion layer regions to realize a reduction in sheet resistance. In particular, titanium silicide ($TiSi_2$) and cobalt silicide ($CoSi_2$) are used because of low resistance and thermal stability.

When titanium silicide is used there is a problem with the fine line effect in that it becomes difficult to reduce resistance due to inhibition of phase transition from the C49-phase titanium silicide of high resistance (C49-$TiSi_2$) to the C54 phase of low resistance (C54-$TiSi_2$) when titanium silicide is formed on a fine pattern. Moreover, it is a known fact that there is a dramatic increase in sheet resistance of titanium silicide due to aggregation of titanium silicide and disconnection of the silicide layer when lines are as fine as 0.1 μm. Consequently, it is necessary to control the fine line effect and aggregation of titanium silicide when titanium silicide is used.

When cobalt silicide is used, there is none of the fine line effect that is generated when titanium silicide is used. In particular, it is reported in IEDM Tech Dig., p 449, 1995 that a reduction in resistance with up to fine lines of 0.075 μm can be realized by forming titanium nitride film as the cap film on the top surface of cobalt and thereby inhibiting oxidation of the cobalt surface with this cap film.

Therefore, it appears that cobalt salicide technology using titanium nitride cap film is useful for the formation of fine devices of 0.1 μm.

A conventional method of producing semiconductor devices using cobalt salicide technology will be described below while referring to FIG. 3. FIGS. 3(A) through (F) are a flow chart that explains the production processes of this conventional technology. Each figure is a cross section of the semiconductor device.

First, as shown in FIG. 3(A), diffusion layer 102 and field insulation film 104 are formed on the surface region on the top of substrate 100, while gate insulation film 106 is formed on the top of substrate 100 and gate electrode 108 is formed on the top of gate insulation film 106. Side walls 109 are then set up as usual.

Next, as shown in FIG. 3(B), cobalt film 110 is formed so that it covers substrate 100, diffusion layer 102, field insulation film 104, gate insulation film 106, gate electrode 108, and side walls 109 and titanium nitride film 112 is formed as cap film so that it covers the top of cobalt film 110.

Next, as shown in FIG. 3(C), cobalt film 110 adjoining diffusion layer 102 and diffusion layer 102 and cobalt film 110 adjoining gate electrode 108 and gate electrode 108 are each reacted by RTA (rapid thermal annealing) at a temperature within a temperature range of 450° C. to 600° C. to form CoSi layers 114a, 114b and 116. This RTA treatment serves as the first RTA.

Then, as shown in FIG. 3(D), titanium nitride film 112 is removed using an ammonia-hydrogen peroxide-water mixture.

Next, as shown in FIG. 3(E), unreacted cobalt film 110 is removed using a sulfuric acid-hydrogen peroxide-water mixture ($H_2SO_4$—$H_2O_2$ (sulfuric acid hydrogen peroxide mixture)) or hydrochloric acid-hydrogen peroxide-water mixture (HCl—$H_2O_2$—$H_2O$).

Finally, as shown in FIG. 3(F), CoSi layers 114a, 114b, and 116 are reacted by performing RTA at a temperature within a temperature range of 750° C. to 900° C. to form $CoSi_2$ layers 114a', 114b', and 116'. This RTA treatment serves as the second RTA.

It has been confirmed by SEM (scanning electron microscope) observation of $CoSi_2$ layer parts 114a', 114b', and 116' that the edges of the $CoSi_2$ layers have been worn away in semiconductor devices produced using prior art.

FIG. 4 is a typical example of the edges of the $CoSi_2$ from SEM observation. Moreover, FIG. 4 is an enlargement of the main parts of the figure during process (F) in FIG. 3. The dotted line 'a' shows the part where edges have been worn away by the above-mentioned etching.

There are problems when the $CoSi_2$ is worn away in this manner in that $CoSi_2$ sheet resistance increases and the fluctuations in resistance become larger, etc. The reason for this is that when titanium nitride film is removed with an ammonia-hydrogen peroxide-water mixture, the film is etched up to the CoSi layer, which is on the bottom of the titanium nitride film, and as a result, the CoSi film becomes thinner, and the $CoSi_2$ film that is then formed by the second RTA treatment becomes even thinner.

SUMMARY OF THE INVENTION

The object of the present invention is to present an etching liquid with which titanium nitride film can be removed without thinning of the CoSi layer thin.

Moreover, another object of the present invention is to present a method of producing semiconductor devices using the above-mentioned etching liquid.

According to an aspect of the present invention, the etching liquid for removal of titanium nitride film on the top of the cobalt film or CoSi layer is a hydrogen peroxide-water mixture.

When a hydrogen peroxide-water mixture is used in this way, etching of the CoSi layer can be controlled and therefore, thinning of the $CoSi_2$ layer can be prevented. That is, it is possible to avoid an increase in sheet resistance and an increase in fluctuations in resistance of the $CoSi_2$.

According to another aspect of the present invention, a hydrogen peroxide-water mixture serves as the etching liquid for removal of the titanium film on the top of the cobalt film or CoSi layer.

When a hydrogen peroxide-water mixture is used in this way, etching of the CoSi layer can be controlled and therefore, thinning of the $CoSi_2$ layer can be prevented. That is, it is possible to avoid an increase in sheet resistance and an increase in fluctuations in resistance of the $CoSi_2$.

According to another aspect of the present invention, a hydrogen peroxide-water mixture (also referred to as peroxide mixture) is used as the etching liquid for removal of titanium nitride film in the method of producing semiconductor devices by cobalt salicide technology with titanium nitride film as the cap film.

Thus, it is possible to remove titanium nitride film without effecting the cobalt film or the CoSi layer when a hydrogen peroxide-water mixture is used.

Moreover, the concentration of the hydrogen peroxide-water mixture should be within a range of 1 to 30 vol % hydrogen peroxide in terms of water.

The etching speed can be controlled, and it is possible to remove titanium nitride film without removing the cobalt film or the CoSi layer, even if the etching liquid comes into contact with the cobalt film or CoSi layer, when the concentration is kept within this range.

Moreover, the preferred concentration of the hydrogen peroxide-water mixture is within a range of 10 to 20 vol % hydrogen peroxide in terms of water.

The titanium nitride film can be efficiently removed when concentration is kept within this range.

Furthermore, according to another aspect of the present invention, there is provided a method of producing a semiconductor device. The method comprises the steps of forming cobalt film on the top of a silicon substrate, which has a gate electrode and a diffusion layer, forming titanium nitride film as the cap film on the top of this cobalt film, selectively reacting the silicon of the silicon substrate and the cobalt of the cobalt film, and removing the titanium nitride film using a hydrogen peroxide-water mixture.

By using this type of production method it is possible to remove the titanium nitride film without etching the CoSi layer that has been produced as a result of the reaction or the unreacted cobalt film, which are on the bottom of the titanium nitride film.

Moreover, since the titanium nitride film can be removed in this way without affecting the cobalt film or the CoSi layer, it is possible to prevent thinning of the $CoSi_2$ layer with the second RTA. That is, it is possible to avoid an increase in sheet resistance and an increase in fluctuations in resistance of the $CoSi_2$.

By means of the method of producing semiconductor devices by cobalt salicide technology with titanium film as the cap film of the present invention, a hydrogen peroxide-water mixture is used as the etching liquid for removal of the titanium film.

When a hydrogen peroxide-water mixture is used in this manner, it is possible to remove the titanium film without affecting the cobalt film or the CoSi layer.

Moreover, the concentration of the hydrogen peroxide-water mixture should be within a range of 1 to 30 vol % hydrogen peroxide in terms of water.

The etching speed can be controlled, and it is possible to remove the titanium film without removing the cobalt film or the CoSi layer, even if the etching liquid comes into contact with the cobalt film or CoSi layer, when the concentration is kept within this range.

Moreover, the preferred concentration of the hydrogen peroxide-water mixture is within a range of 10 to 20 vol % hydrogen peroxide in terms of water.

The titanium film can be efficiently removed when the concentration is kept within this range.

Furthermore, according to another aspect of the present invention, there is provided a method of producing a semiconductor device. The method comprises the steps of forming cobalt film on the top of a silicon substrate, which has a gate electrode and a diffusion layer, forming titanium film as the cap film on the top of this cobalt film, selectively reacting the silicon of the silicon substrate and the cobalt of the cobalt film, and removing the titanium film using a hydrogen peroxide-water mixture.

By using this type of production method, it is possible to remove the titanium film without etching the CoSi layer that has been produced as a result of the reaction or the unreacted cobalt film, which are on the bottom of the titanium film.

Moreover, since the titanium film can be removed in this way without affecting the cobalt film or the CoSi layer, it is possible to prevent thinning of $CoSi_2$ layer. That is, it is possible to avoid an increase in sheet resistance and an increase in fluctuations in resistance of the $CoSi_2$.

By means of the method of producing semiconductor devices by cobalt salicide technology with titanium nitride film as the cap film of the present invention, titanium nitride film is removed by a first removal step using an ammonia-hydrogen peroxide-water mixture and by a second removal step using a hydrogen peroxide-water mixture.

It is possible to remove the titanium nitride film without affecting the cobalt film or the CoSi layer by using this method. The etching speed on titanium nitride is faster with an ammonia-hydrogen peroxide-water mixture than with a hydrogen peroxide-water mixture and therefore, the titanium nitride film can be more efficiently removed than when only a hydrogen peroxide-water mixture is used.

In addition, the preferred concentration of the ammonia-hydrogen peroxide-water mixture should be within a range of 1 to 30 vol % hydrogen peroxide in terms of water and 1 to 30 vol % ammonia in terms of water, and the preferred concentration of the above-mentioned hydrogen peroxide-water mixture should be within a range of 1 to 30 vol % hydrogen peroxide in terms of water.

The etching speed can be controlled, and it is possible to remove titanium nitride film without removing the cobalt film or the CoSi layer, even if the etching liquid comes into contact with the cobalt film or CoSi layer, when the concentration is kept within this range.

The preferred concentration of the ammonia-hydrogen peroxide-water mixture is within a range of 10 to 20 vol % hydrogen peroxide in terms of water and 5 to 20 vol % ammonia in terms of water and the preferred concentration of the above-mentioned hydrogen peroxide-water mixture is within a range of 1 to 30 vol % hydrogen peroxide in terms of water.

The titanium nitride film can be efficiently removed when the concentration is within this range.

Furthermore, according to another aspect of the present invention, there is provided a method of producing a semiconductor device. The method comprises the steps of forming cobalt film on the top of a silicon substrate, which has a gate electrode and a diffusion layer, forming titanium nitride film as the cap film on the top of this cobalt film, selectively reacting the silicon of the silicon substrate and the cobalt of the cobalt film, removing the titanium nitride film by a first removal step using an ammonia-hydrogen peroxide-water mixture, and removing the titanium nitride film by, a second removal step using a hydrogen peroxide-water mixture.

It is possible to remove the titanium nitride film without affecting the cobalt film or the CoSi layer by using this method. Moreover, the etching speed on titanium nitride is faster with an ammonia-hydrogen peroxide-water mixture than with a hydrogen peroxide-water mixture and therefore, the titanium nitride film can be more efficiently removed than when only a hydrogen peroxide-water mixture is used.

By means of the method of producing semiconductor devices of the present invention using cobalt salicide technology with titanium film as the cap film, titanium film is removed by a first removal step using an ammonia-hydrogen peroxide-water mixture and is removed by a second removal step using a hydrogen peroxide-water mixture.

It is possible to remove the titanium film without affecting the cobalt film or the CoSi layer by using this method. The etching speed on titanium is faster with an ammonia-hydrogen peroxide-water mixture than with a hydrogen peroxide-water mixture and therefore, the titanium film can be more efficiently removed than when only a hydrogen peroxide-water mixture is used.

The preferred concentration of the ammonia-hydrogen peroxide-water mixture should be within a range of 1 to 30 vol % hydrogen peroxide in terms of water and 1 to 30 vol % ammonia in terms of water and the preferred concentration of the above-mentioned hydrogen peroxide-water mixture should be within a range of 1 to 30 vol % hydrogen peroxide in terms of water.

The etching speed can be controlled, and it is possible to remove titanium film without removing cobalt film or CoSi layer, even if the etching liquid comes into contact with the cobalt film or CoSi layer, when the concentration is kept within this range.

The preferred concentration of the ammonia-hydrogen peroxide-water mixture is within a range of 10 to 20 vol % hydrogen peroxide in terms of water and 5 to 20 vol % ammonia in terms of water, and the preferred concentration of the above-mentioned hydrogen peroxide-water mixture is within a range of 1 to 30 vol % in terms of water.

The titanium film can be efficiently removed when the concentration is kept within this range.

Furthermore, according to anther aspect of the present invention, there is provided a method of producing a semiconductor device. The method comprises the steps of forming cobalt film on the top of a silicon substrate, which has a gate electrode and a diffusion layer, forming titanium film as the cap film on the top of this cobalt film, selectively reacting the silicon of the silicon substrate and the cobalt of the cobalt film, removing the titanium film by a first removal step using an ammonia-hydrogen peroxide-water mixture, and removing the titanium film by a second removal step using a hydrogen peroxide-water mixture.

It is possible to remove the titanium film without affecting the cobalt film or the CoSi layer by using this method. Moreover, the etching speed on titanium is faster with an ammonia-hydrogen peroxide-water mixture than with a hydrogen peroxide-water mixture and therefore, the titanium film can be more efficiently removed than when only a hydrogen peroxide-water mixture is used.

BRIEF DESCRIPTION OF THE DRAWINGS

The foregoing and other objects, features and advantages of the present invention will be better understood from the following description taken in connection with accompanying drawings, in which.

DESCRIPTION OF THE PREFERRED EMBODIMENTS

Figure 1A:
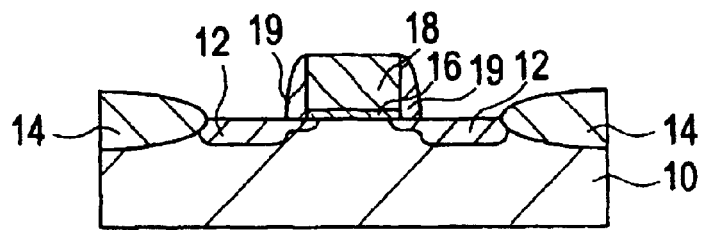
FIGS. 1(A) through 1(F) are diagrams of the processes involved in the production of semiconductor devices of a first embodiment of the present invention.

Embodiments of the present invention will now be described while referring to the drawings. Furthermore, the drawings only roughly show the shape, size and position correlation in order to describe the present invention. Moreover, the conditions, such as numbers, etc., and materials, etc., listed below are merely examples. Therefore, the present invention is not limited in any way to these embodiments.

Moreover, the etching rate on the titanium nitride film, cobalt film, and CoSi layer with an ammonia-hydrogen peroxide-water mixture ($NH_4OH$—$H_2O_2$—$H_2O$ (ammonia-hydrogen peroxide mixture)), sulfuric acid-hydrogen peroxide-water mixture, hydrochloric acid-hydrogen peroxide-water mixture, and hydrogen peroxide-water mixture ($H_2O_2$—$H_2O$ (peroxide mixture)) are shown in Table 1. The volume ratios of these mixtures are as given below: That is, it is $NH_4OH:H_2O_2:H_2O=1:1:5$ with the ammonia-hydrogen peroxide-water mixture. The volume ratio is $H_2O_2:H_2O=1:5$ with the hydrogen peroxide-water mixture. The volume ratio is $H_2SO_4:H_2O_2:H_2O=7:2:1$ with the sulfuric acid-hydrogen peroxide-water mixture. Moreover, it is $HCl:H_2O_2:H_2O=1:1:5$ with the hydrochloride acid-hydrogen peroxide-water mixture. Etching was performed with the respective mixture temperature being within a temperature range of 40 to 50° C. The determination method is as follows: For instance, in order to determine the etching rate when TiN film is etched using an ammonia-hydrogen peroxide-water mixture, a wafer on which a TiN film has been formed to a film thickness of 2,000 Å is washed for 30 seconds with an ammonia-hydrogen peroxide-water mixture under the above-mentioned conditions and then the film that remains after washing is determined by fluorescent light X-rays. This same treatment is repeated several times and the etching rate is determined. The etching rate is determined by the same method as the above-mentioned method with other solutions and etched films.

TABLE 1

| | TiN film | Co film | CoSi layer |
|---|---|---|---|
| Ammonia-hydrogen peroxide-water mixture | 107 Å/min | 4.7 Å/min | 2.6 Å/min |
| Hydrogen peroxide-water mixture | 37.4 Å/min | 0 Å/min | 0 Å/min |
| Sulfuric acid-hydrogen peroxide-water mixture | 5 Å/min | At least 1000 Å/min | 0 Å/min |
| Hydrochloric acid-hydrogen peroxide-water mixture | 9 Å/min | At least 1000 Å/min | 0 Å/min |

As shown in Table 1, the etching rate on the titanium nitride film, cobalt film, and CoSi layer with an ammonia-hydrogen peroxide-water mixture was 107 Å/min, 4.7 Å/min, and 2.6 Å/min, respectively, the etching rate on the titanium nitride film, cobalt film and CoSi layer with a hydrogen peroxide-water mixture was 37.4 Å/min, 0 Å/min, and 0 Å/min, respectively, the etching rate on the titanium nitride film, cobalt film and CoSi layer of a sulfuric acid-hydrogen peroxide-water mixture was 5 Å/min, at least 1,000 Å/min, and 0 Å/min, respectively, and the etching rate on the titanium nitride film, cobalt film and CoSi layer of a hydrochloric acid-hydrogen peroxide-water mixture was 9 Å/min, at least 1,000 Å/min, and 0 Å/min, respectively.

It is clear from the above-mentioned results that although the etching rate of the ammonia-hydrogen peroxide-water mixture is slow, the CoSi layer is etched. Consequently, when the cobalt layer and CoSi layer come into contact with the etching liquid after etching the titanium nitride and titanium, the cobalt film and CoSi layer are etched where the titanium nitride film is thin and film thickness becomes even thinner.

In contrast to this, since the etching rate on the cobalt film and CoSi layer with a hydrogen peroxide-water mixture is 0 Å/min, there is no danger of etching the CoSi, even where the titanium nitride film is thin.

First Embodiment

Next, the method of producing semiconductor devices (or elements) of the first embodiment will be described while referring to FIG. 1.

FIG. 1(A) through FIG. 1(F) are cross sections for describing the production processes involved in the method of producing semiconductor devices of the first embodiment.

As shown in FIG. 1(A), diffusion layer 12 and field insulation film 14 are formed on the surface region on the top of silicon substrate 10 and further, gate insulation film 16 is formed on the top of substrate 10 and gate electrode 18 is formed with polysilicon on the top of gate insulation film 16, as with prior art. Side walls 19 are then formed as usual on the sides of gate electrode 18.

Figure 1B:
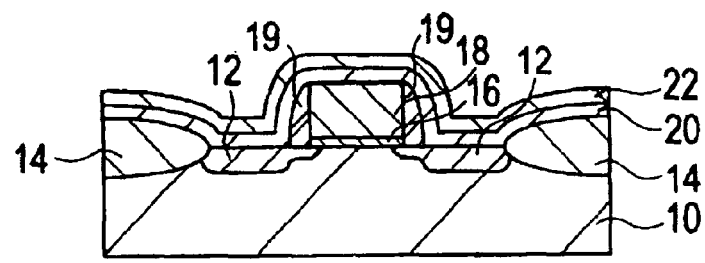

Next, as shown in FIG. 1(B), cobalt film 20 is formed by sputtering to an appropriate thickness within a range of 5 to 20 nm so that substrate 10, diffusion layer 12, field insulation film 14, gate insulation film 16, gate electrode 18, and side walls 19 are covered. Then titanium nitride film 22 is formed as cap film by sputtering to an appropriate thickness within a range of 10 to 100 nm so that the top of cobalt film 20 is covered.

Figure 1C:
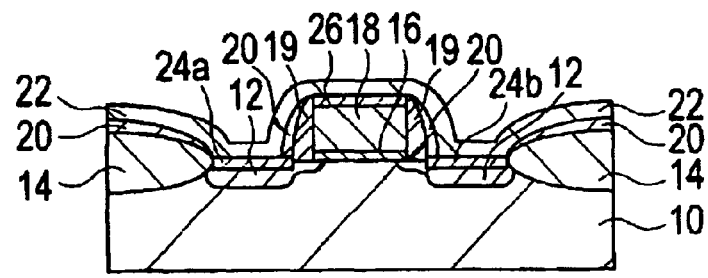

Next, as shown in FIG. 1(C), first RTA treatment is performed, at a temperature within a temperature range of 450° C. to 600° C., between each of the cobalt film 20 adjoining diffusion layer 12 and diffusion layer 12 and cobalt film 20 adjoining gate electrode 18 and gate electrode 18 to form CoSi layers 24a, 24b and 26 as a result of the reaction. Part of cobalt film 20 adjoining field insulation film 14 and side walls 19 remains as unreacted cobalt film after this RTA treatment.

Figure 1D:
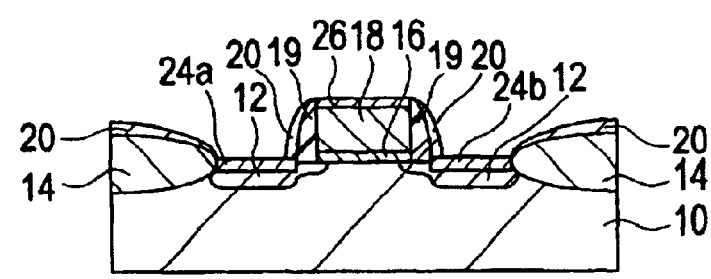

Next, as shown in FIG. 1(D), titanium nitride film 22 is removed using a hydrogen peroxide-water mixture, here for instance, a hydrogen peroxide-water mixture with a concentration of 20 vol % hydrogen peroxide in terms of water ($H_2O_2:H_2O=1:5$ (volume ratio)).

Figure 1E:
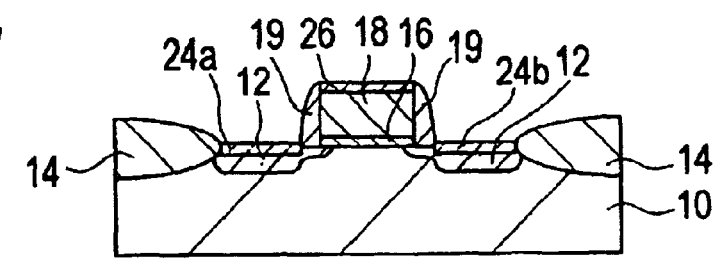

Then, as shown in FIG. 1(E), the unreacted cobalt film 20 is removed using a sulfuric acid-hydrogen peroxide-water mixture or a hydrochloric acid-hydrogen peroxide-water mixture. Here, the film is removed using, for instance, a sulfuric acid-hydrogen peroxide-water mixture with a concentration of 20 vol % sulfuric acid to water and 20 vol % hydrogen peroxide to water ($H_2SO_4:H_2O_2:H_2O=1:1:5$ (volume ratio)). CoSi Layers 24a, 24b and 26 remain after this removal.

Figure 1F:
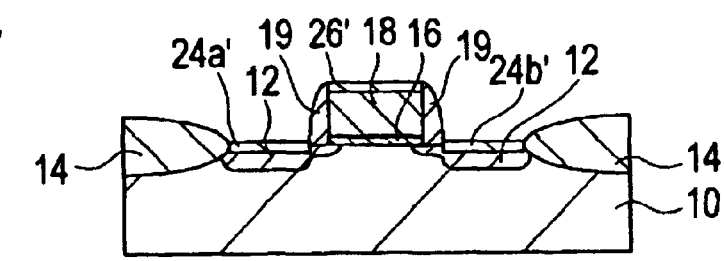

Finally, as. shown in FIG. 1(F), the remaining CoSi layers 24a, 24b, and 26 are reacted with the silicon Si of the substrate and the gate electrode by performing the second RTA treatment at a temperature within a temperature range of 750° C. to 900° C. to form $CoSi_2$ layers 24a', 24b', and 26'.

Thus, it is possible to control etching on the CoSi layer by using the production method of the present invention and therefore, it is possible to remove the titanium nitride film without thinning the cobalt film and CoSi layer, even if etching liquid comes into contact with the cobalt film and CoSi layer during etching of the titanium nitride film.

Consequently, it is possible to avoid a subsequent increase in sheet resistance and an increase in fluctuations in resistance of the $CoSi_2$ that have been formed by the second RTA treatment.

Titanium film can also be used in place of the titanium nitride film.

Furthermore, by means of the first embodiment, etching was performed with the temperature of each mixture being within a temperature range of 40° C. to 50° C., but it is also possible to adjust the etching rate by increasing the mixture temperature when an increase in the etching rate is desired, by reducing the mixture temperature when a reduction in the etching rate is desired, etc.

Second Embodiment

The method of producing semiconductors of a second embodiment of the present invention will be described while referring to FIG. 2.

FIG. 2(A) through FIG. 2(G) are a flow chart for describing the method of producing semiconductor devices of a second embodiment of the present invention.

Figure 2A:
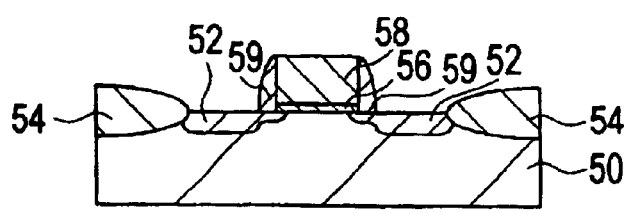
FIGS. 2(A) through (G) are diagrams of the processes involved in the production of semiconductor devices of a second embodiment of the present invention.

As shown in FIG. 2(A), diffusion layer 52 and field insulation film 54 are formed on the surface region on the top of silicon substrate 50, while gate insulation film 56 is formed on the top of substrate 50 and polysilicon gate electrode 58 is formed on the top of gate insulation film 56. Then side walls 59 are formed as usual on the sides of gate electrode 58.

Figure 2B:
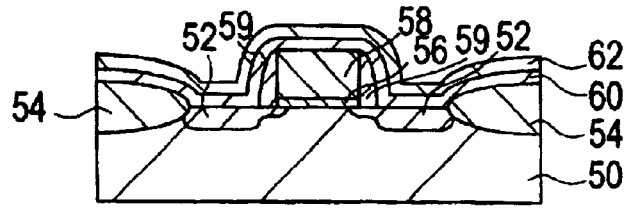

Next, as shown in FIG. 2(B), cobalt film 60 is formed by sputtering to an appropriate thickness within a range of 5 to 20 nm so that substrate 50, diffusion layer 52, field insulation film 54, gate insulation film 56, and gate electrode 58 are, covered. Then titanium nitride film 62 is formed as the cap film by sputtering to an appropriate thickness within a range of 10 to 100 nm so that the top of cobalt film 60 is covered.

Figure 2C:
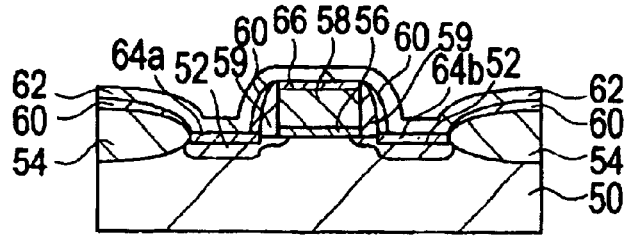

Next, as shown in FIG. 2(C), first RTA treatment is performed, at a temperature within a temperature range of 450° C. to 600° C., between each of cobalt film 60 adjoining diffusion layer 52 and diffusion layer 52 and cobalt layer 60 adjoining gate electrode 58 and gate electrode 58 to form CoSi layers 64a, 64b, and 66 as a result of this reaction. Part of cobalt film 60 adjoining field insulation film 54 and side walls 59 remains as unreacted cobalt film after this RTA treatment.

Figure 2D:
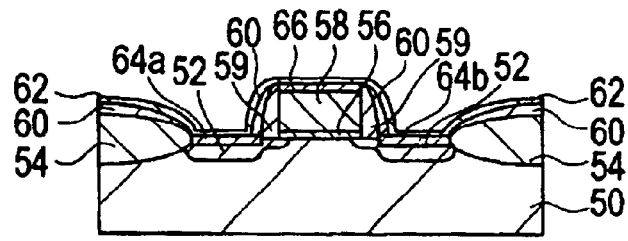

Next, as shown in FIG. 2(D), titanium nitride film 62 is removed using an ammonia-hydrogen peroxide-water mixture, with the concentration here being, for instance, 20 vol % ammonia in terms of water ($NH_3:H_2O_2:H_2O=1:1:5$ (volume ratio)), only for a time with which the CoSi layer will not be exposed, even where film thickness is thinnest.

For instance, in the case of titanium nitride film thickness of 300 Å, etching time is set to the time in which 100 Å titanium nitride film is etched, with the part of thinnest film thickness being 150 Å. By means of this example, the etching rate on titanium nitride film of an ammonia-hydrogen peroxide-water mixture is 107 Å/minute, as shown in Table 1, and therefore, etching should be performed at an etching time of 56 seconds. Thus, the time should be set so that etching liquid will have no effect on the cobalt film or CoSi layer on the bottom of the titanium nitride film after pre-determining the thinnest titanium nitride film thickness.

Figure 2E:
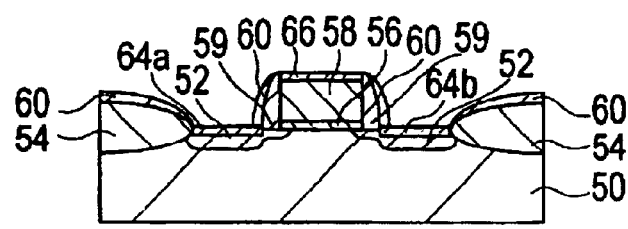
Figure 2F:
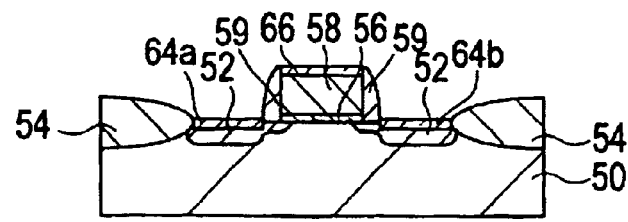

Next, as shown in FIG. 2(E), the remaining titanium nitride film 62,in FIG. 2(D) is removed using a hydrogen peroxide-water mixture with the concentration here being 20 vol % hydrogen peroxide in terms of water ($H_2O_2:H_2O=1:5$ (volume ratio)).

Then, as shown in FIG. 2 (F), the unreacted cobalt film 60 is removed using a sulfuric acid-hydrogen peroxide-water mixture or hydrochloric acid-hydrogen peroxide-water mixture. Here film is removed using, for instance, a sulfuric acid-hydrogen peroxide-water mixture with a concentration of 20 vol % sulfuric acid in terms of water and 20 vol % hydrogen peroxide in terms of water ($H_2SO_4:H_2O_2:H_2O=$ 1:1:5 (volume ratio)).

Figure 2G:
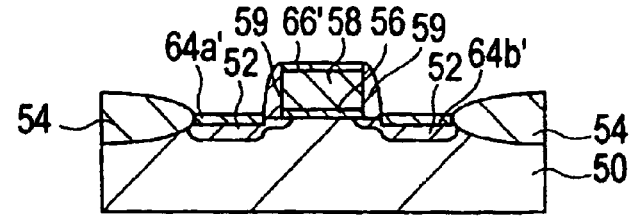
Figure 3A:
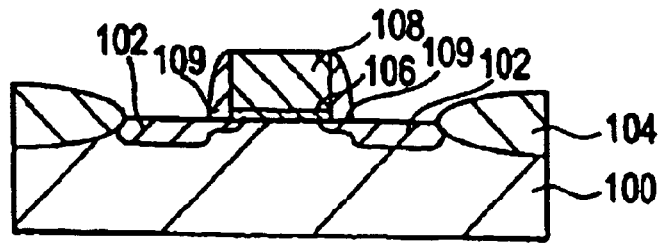
FIGS. 3(A) through (F) are diagrams of the processes involved in the production of semiconductor devices of prior art.
Figure 3B:
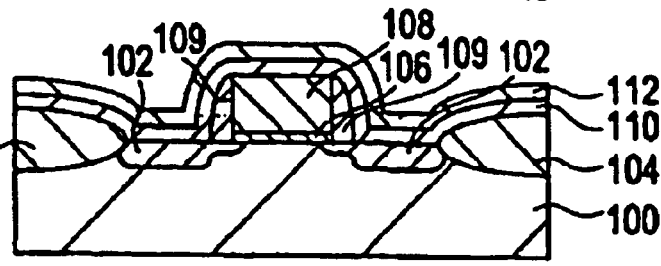
Figure 3C:
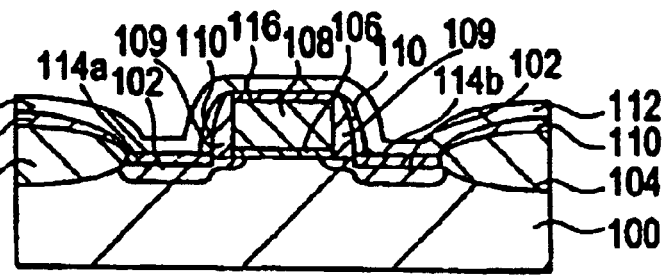
Figure 3D:
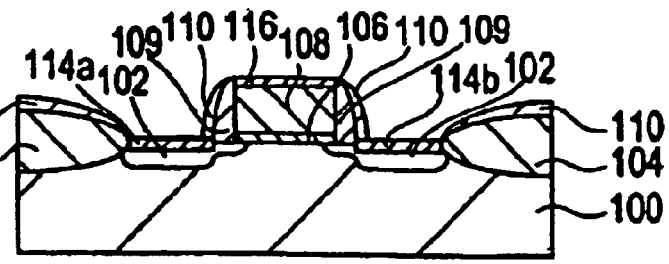
Figure 3E:
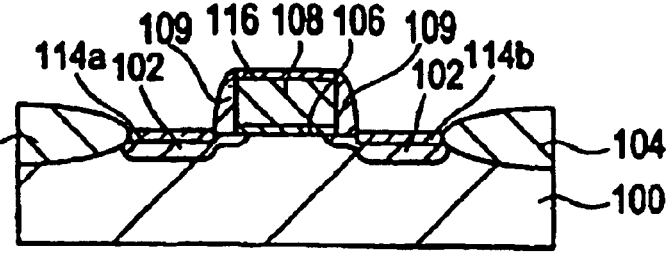
Figure 3F:
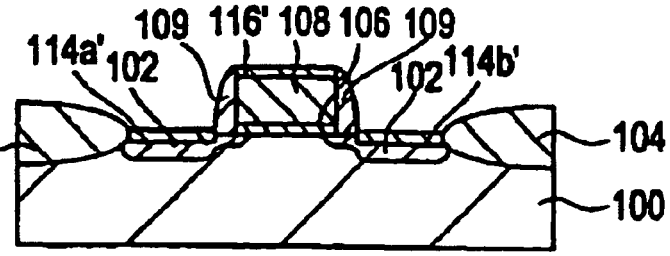
Figure 4:
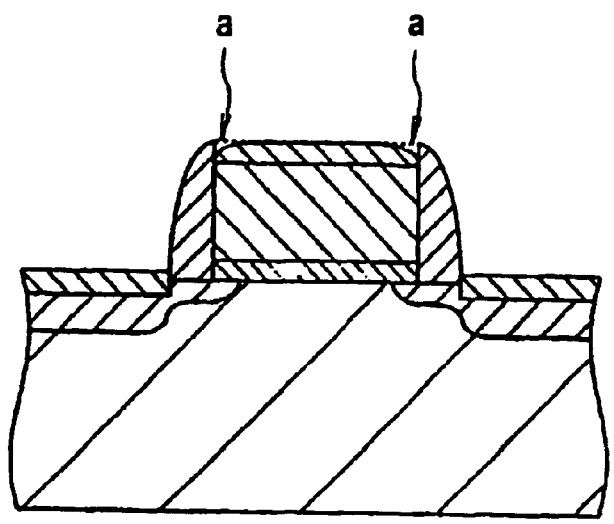
FIG. 4 is a diagram showing the problem points of prior art.

Finally, CoSi layers 64a, 64b and 66 are reacted by performing a second RTA treatment at a temperature within a temperature range of 750° C. to 900° C. and $CoSi_2$ layers 64a', 64b', and 66' are formed, as shown in FIG. 2(G).

Moreover, titanium film can be used in place of the titanium nitride film.

Production can be accomplished more quickly than by the processes in the first embodiment by using this type of production method.

Furthermore, although etching was performed at a mixture temperature within a temperature range of 40° C. to 50° C. in the second embodiment, it is possible to control the etching rate by increasing the mixture temperature when an increase in the etching rate is desired, by reducing the etching mixture temperature when a reduction in the etching rate is desired, etc.

By changing from an ammonia-hydrogen peroxide-water mixture to a hydrogen peroxide-water mixture for the etching liquid used in the removal of titanium nitride film of the method of producing semiconductor devices of the present invention, it is possible to control the rate of etching on the CoSi layer and to prevent thinning of the $CoSi_2$ layer and obtain good sheet resistance with the diffusion layer and gate electrode.

Moreover, since the etching rate on titanium nitride film of the ammonia-hydrogen peroxide-water mixture is greater than the hydrogen peroxide-water mixture, the titanium nitride film can be removed using an ammonia-hydrogen peroxide-water mixture before etching the thinnest parts of the film and then the remaining titanium nitride film can be removed using a hydrogen peroxide-water mixture so that curtailment of production time can be expected while only obtaining good sheet resistance of the diffusion layer and gate electrode.

What is claimed is:

1. A method of producing semiconductor devices by cobalt salicide technology with titanium nitride film as the cap film, comprising:
    removing a first portion of said titanium nitride film which is arranged over underlying cobalt silicide film by a first removal step using an ammonia-hydrogen peroxide-water mixture such that a second portion of said titanium nitride film remains covering said cobalt silicide film; and
    removing said second portion of said titanium nitride film on said cobalt silicide film by a second removal step using a hydrogen peroxide-water mixture so as to expose a surface of the cobalt silicide film without etching thereof.

2. A method of producing semiconductor devices according to claim 1, wherein the concentration of said ammonia-hydrogen peroxide-water mixture is within a range of 1 to 30 vol % hydrogen peroxide in terms of water and within a range of 1 to 30 vol % ammonia in terms of water and the concentration of said hydrogen peroxide-water mixture is within a range of 1 to 30 vol % hydrogen peroxide in terms of water.

3. A method of producing semiconductor devices according to claim 2, wherein the concentration of said ammonia-hydrogen peroxide-water mixture is within a range of 10 to 20 vol % hydrogen peroxide in terms of water and within a range of 5 to 20 vol % ammonia in terms of water and the concentration of said hydrogen peroxide-water mixture is within a range of 1 to 30 vol % hydrogen peroxide in terms of water.

4. A method of producing semiconductor devices, comprising:
    forming cobalt film on the top surface of a silicon substrate, which has a gate electrode and a diffusion film;
    forming titanium nitride film as the cap film on the top surface of said cobalt film;
    selectively reacting the silicon of said silicon substrate and the cobalt of said cobalt film;
    removing a first portion of said titanium nitride film which is arranged over underlying cobalt silicide film by a first removal step using an ammonia-hydrogen-peroxide-water mixture such that a second portion of said titanium nitride film remains covering said cobalt silicide film; and
    removing said second portion of said titanium nitride film remaining on said cobalt silicide film by a second removal step using a hydrogen peroxide-water mixture so as to expose a surface of said cobalt silicide film without etching thereof.

5. A method of producing semiconductor devices by cobalt salicide technology with titanium film as the cap film, comprising:
    removing a first portion of said titanium film which is arranged over underlying cobalt silicide film by a first removal step using an ammonia-hydrogen peroxide-water mixture such that a second portion of said titanium nitride film remains covering said cobalt silicide film; and
    removing said second portion of said titanium film remaining on said cobalt silicide film by a second removal step using a hydrogen peroxide-water mixture so as to expose a surface of said cobalt silicide film without etching thereof.

6. A method of producing semiconductor devices according to claim 5, wherein the concentration of said ammonia-hydrogen peroxide-water mixture is within a range of 1 to 30 vol % hydrogen peroxide in terms of water and within a range of 1 to 30 vol % ammonia terms of water and the concentration of said hydrogen peroxide-water mixture is within a range of 1 to 30 vol % hydrogen peroxide in terms of water.

7. A method of producing semiconductor devices according to claim 6, wherein the concentration of said ammonia-hydrogen peroxide-water mixture is within a range of 10 to 20 vol % hydrogen peroxide in terms of water and 5 to 20 vol % ammonia in terms of water and the concentration of said hydrogen peroxide-water mixture is within a range of 1 to 30 vol % in terms of water.

8. A method of producing semiconductor devices, comprising:
   forming cobalt film on the top surface of a silicon substrate, which has a gate electrode and a diffusion layer;
   forming titanium film as the cap film on the top surface of said cobalt film;
   selectively reacting the silicon of said silicon substrate and the cobalt of said cobalt film;
   removing a first portion of said titanium film which is arranged over underlying cobalt silicide film by a first removal step using an ammonia-hydrogen peroxide-water-mixture such that a second portion of said titanium film remains covering said cobalt silicide film, and
   removing said second portion of said titanium film remaining on said cobalt silicide film by a second removal step using a hydrogen peroxide-water mixture so as to expose a surface of said cobalt silicide film without etching thereof.

* * * * *